(12) United States Patent
Lunde

(10) Patent No.: US 7,344,899 B2
(45) Date of Patent: Mar. 18, 2008

(54) DIE ASSEMBLY AND METHOD FOR FORMING A DIE ON A WAFER

(75) Inventor: Aron T. Lunde, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 224 days.

(21) Appl. No.: 10/053,963

(22) Filed: Jan. 22, 2002

(65) Prior Publication Data
US 2003/0137030 A1     Jul. 24, 2003

(51) Int. Cl.
*H01L 21/66* (2006.01)
(52) U.S. Cl. .................. 438/14; 438/462; 257/620; 257/E21.523
(58) Field of Classification Search ........... 257/620, 257/690, 786, 619, E21.521, E21.523, E21.524; 438/14, 612, 17, 613
See application file for complete search history.

(56) References Cited

U.S. PATENT DOCUMENTS

| | | | | |
|---|---|---|---|---|
| 5,334,857 A | * | 8/1994 | Mennitt et al. ............... 257/48 |
| 5,378,981 A | * | 1/1995 | Higgins, III ................. 324/765 |
| 5,554,940 A | * | 9/1996 | Hubacher .................... 324/765 |
| 5,661,407 A | * | 8/1997 | Shibata ....................... 324/763 |
| 5,923,047 A | * | 7/1999 | Chia et al. .................... 257/48 |
| 5,982,042 A | * | 11/1999 | Nakamura ................... 257/786 |
| 6,303,948 B1 | * | 10/2001 | Kudou et al. ................ 257/207 |
| 6,429,532 B1 | * | 8/2002 | Han et al. .................... 257/781 |
| 6,534,853 B2 | * | 3/2003 | Liu et al. ..................... 257/692 |
| 6,828,812 B2 | * | 12/2004 | Farnworth et al. .......... 324/757 |
| 2003/0010977 A1 | * | 1/2003 | Fenner et al. ................ 257/48 |
| 2003/0143764 A1 | * | 7/2003 | Akram et al. ................. 438/15 |
| 2004/0177298 A1 | * | 9/2004 | Farnworth et al. .......... 714/724 |

OTHER PUBLICATIONS

Applicant is not aware of any patents, publications, or other information for consideration by the patent office.

* cited by examiner

*Primary Examiner*—Brook Kebede
*Assistant Examiner*—Khiem D Nguyen
(74) *Attorney, Agent, or Firm*—Fletcher Yoder PC

(57) ABSTRACT

A method for forming a die on a wafer is provided. The method includes forming on a wafer a die having an active portion that includes integrated circuitry. The method further includes forming at least one input bond pad on the active portion and at least one test pad on the die. A conductive path is formed between the input bond pad and the test pad. A portion of the conductive path is formed on the die outside of the active portion of the die.

21 Claims, 3 Drawing Sheets

DIE ASSEMBLY AND METHOD FOR FORMING A DIE ON A WAFER

FIELD OF THE INVENTION

The present invention relates to integrated circuits and more particularly to a die assembly and method for forming a die on a wafer.

BACKGROUND OF THE INVENTION

Modern integrated circuit technology typically involves the formation of die of operational circuitry formed on a wafer of semiconductor material. Referring to FIG. 1, one or more dies 2 may be formed in a conventional manner on a wafer 4, which is formed from a semiconductor material such as silicon. The dies 2 are integrated circuits or devices that have been formed but have not been detached from the wafer 4. For clarity, only one row of dies 2 is shown, but it will be understood that generally multiple rows and columns of dies 2 are formed to substantially fill the wafer 4. Each die 2 includes an active portion 1 surrounded by an inactive portion 3. The active portion 1 includes the integrated circuitry of the die. Typically, no integrated circuitry is formed in the inactive portion 3. A plurality of input bond pads 6 typically is formed on the active portion 1 of die 2 and is connected to the integrated circuitry of the die. The dies are separated by a spacing 8 referred to as the "scribe". The scribe is formed of a non-conducting material that forms wafer 4 and typically has a width in the range of about 700 to about 900 microns, although scribe 8 can have any width suitable for isolating adjacent die. No integrated circuits are formed in the scribe.

During a typical wafer test procedure, such as during wafer-level burn-in testing, conventional testing apparatus (not shown) are used to electrically test the dies 2 while still on the wafer 4. The testing apparatus includes mechanical probes that physically contact the metal input bond pads 6 of the dies 2. The input bond pads 6 provide a connection for the input of electrical signals to the integrated circuitry formed on the die and also provide a connection point for testing the integrated circuitry formed on the die. A limitation associated with such a wafer test procedure is that the input bond pads 6 may be too small to be suitably accessible by the mechanical probes of the testing apparatus. For example, input bond pads 6 typically are square in shape and may be as small as only 105 microns on each side. Another limitation associated with such a wafer test procedure is that the input bond pads 6 may be situated on the wafer so as to be difficult to access by the testing apparatus.

Accordingly, there is a need for a method for forming a die on a wafer wherein the die can be accurately tested before the die is separated from a wafer. There is a further need for a die assembly for forming a die on a wafer wherein the die assembly is configured to permit accurate testing of the die before the die is separated from the wafer.

SUMMARY OF THE INVENTION

This summary of the invention section is intended to introduce the reader to aspects of the invention and is not a complete description of the invention. Particular aspects of the invention are pointed out in other sections hereinbelow, and the invention is set forth in the appended claims which alone demarcate its scope.

In accordance with an exemplary embodiment of the present invention, a method for forming a die is provided. The method includes forming on a wafer a die having an active portion comprising integrated circuitry. The die has at least one input bond pad formed on the active portion. The method also includes forming at least one test pad on the die and forming a conductive path between the input bond pad and the test pad. A portion of the conductive path is formed on the die outside of the active portion of the die.

In accordance with another exemplary embodiment of the present invention, a die assembly including a die formed on a wafer is provided. The die has an active portion that includes integrated circuitry. At least one input bond pad is formed on the active portion of the die and at least one test pad is formed on the die. A conductive path electrically couples the input bond pad to the test pad. A portion of the conductive path is formed outside of the active portion of the die.

In accordance with a further exemplary embodiment of the present invention, a method for preparing a die on a wafer for testing by a testing apparatus is provided. The method includes forming on a wafer a die having an active portion that includes integrated circuitry. The method also includes forming a plurality of input bond pads on the active portion of the die and forming a plurality of test pads on the die. The test pads are accessible to the testing apparatus. Each test pad corresponds to one of the input bond pads. A conductive path is formed between each of the test pads and the corresponding input bond pads. A portion of each of the conductive paths is formed outside of the active portion of the die. The method further includes testing the die by contacting at least one of the test pads with the testing apparatus.

In accordance with yet another exemplary embodiment of the present invention, a die has an active portion including integrated circuitry. A plurality of input bond pads is formed on the active portion and a plurality of test pads is formed on the die. The die also includes conductive lines that are initially formed to electrically couple each of the input bond pads with one of the test pads. A portion of each of the conductive lines is formed on an area outside of the active portion of the die and is subsequently severed at a point outside of the active portion.

These and other aspects of the present invention are described in the following description, attached drawings and claims.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EXEMPLARY EMBODIMENTS

The following description is of exemplary embodiments only and is not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
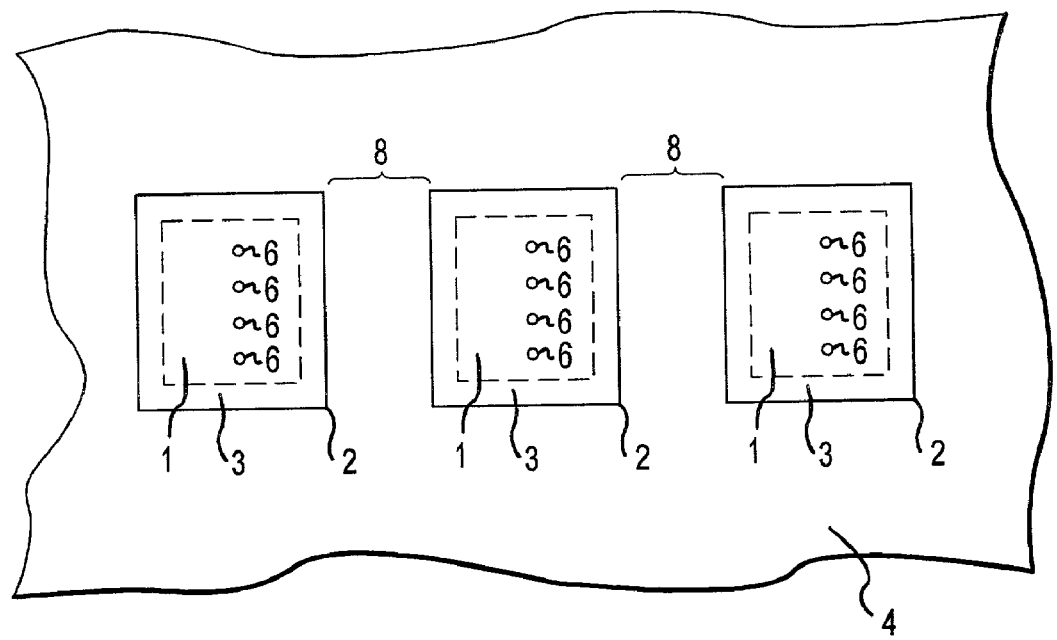
FIG. 1 is a schematic illustration of a semiconductor wafer with die formed thereon as is known in the art.
Figure 2:
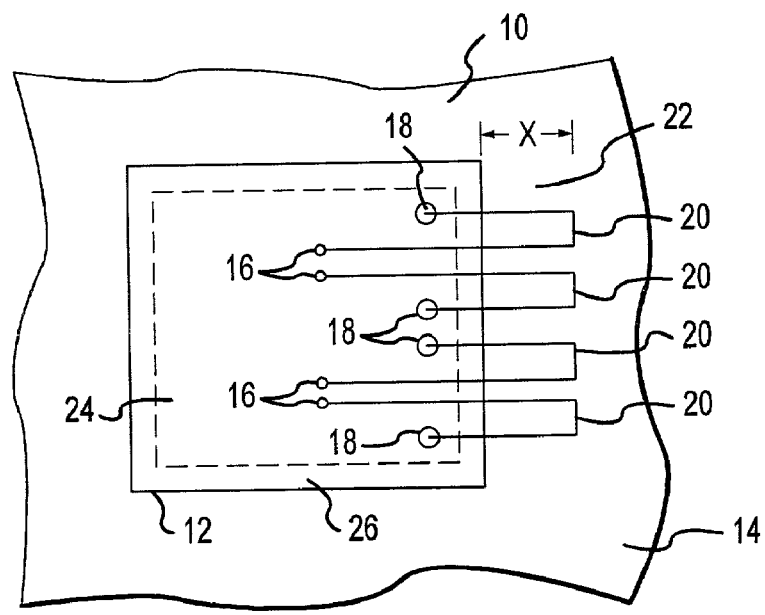
FIG. 2 is a schematic illustration of a wafer with a die assembly formed thereon in accordance with an exemplary embodiment of the present invention.

FIG. 2 illustrates a die assembly 10 in accordance with an exemplary embodiment of the invention. A die 12 is formed on a wafer 14 in a conventional manner as is well known and widely practiced in the semiconductor industry. For purposes of clarity, only a portion of the wafer 14 is illustrated and additional dies that may be formed on that wafer have been omitted from FIG. 2. Die 12 includes an active portion 24 surrounded by an inactive portion 26. Active portion 24 includes the integrated circuitry of the die. A minimal amount of integrated circuitry may be formed in the inactive portion 26, although preferably no integrated circuitry integral to the functioning of the die is formed in the inactive portion. The active portion 24 of die 12 includes a plurality of input bond pads 16 and a plurality of test pads 18. Input bond pads 16 are connected to the integrated circuitry (not shown) of die 12. Each of the test pads 18 corresponds to one or more of the input bond pads 16. Alternatively, each of the input bond pads 16 may correspond to one or more of the test pads 18. For purposes of clarity, FIG. 2 illustrates one input bond pad 16 connected to one test pad 18. Test pads 18 are configured to be suitably accessible by mechanical probes of a testing apparatus. For example, test pads 18 may be of a relatively square shape measuring approximately 330 microns on each side, although it will be appreciated that test pads 18 may be of any suitable size that permits a testing apparatus to access a test pad for accurate testing.

Each of input bond pads 16 is electrically coupled to a test pad 18 by a conductive path 20. Conductive path 20 is typically formed of a conductive metal, such as aluminum, an aluminum copper alloy, and the like. By physically accessing test pads 18, a testing apparatus can electrically access and test the circuitry of die 12 that is coupled to the input bond pads 16. Accordingly, the structure of the present invention may be used when input bond pads 16 are not readily accessible by the testing apparatus. For example, input bond pads 16 may be of a relatively small size such that suitable contact between the input bond pads and the testing apparatus cannot be made. Alternatively, input bond pads may be arranged on the die so as to be difficult to access by the testing apparatus. The test pads 18 are preferably configured to be of sufficient size such that a testing apparatus may make contact with the test pads in a manner suitable for accurate testing of the integrated circuits of the die. In addition, test pads 18 are preferably arranged on the die so as to be readily accessible by the testing apparatus. Thus, by contacting the test pads 18, which are configured to be accessible by a testing apparatus, testing of the integrated circuits of the die is not restricted by the size or location of the input bond pads.

As illustrated in FIG. 2, conductive paths 20 extend from input bond pads 16 to a scribe 22 and from the scribe 22 to the test pads 18. Preferably, conductive paths 20 may extend a suitable distance, indicated by "x" in FIG. 2, into scribe 22. In this manner, conductive paths 20 may be severed at a point within the scribe, as described in more detail below, without adversely affecting the physical or electrical characteristics of die 12. Alternatively, the conductive paths may suitably extend to the periphery of die 12 where they can be severed upon separation of the die from wafer 14.

Figure 3:
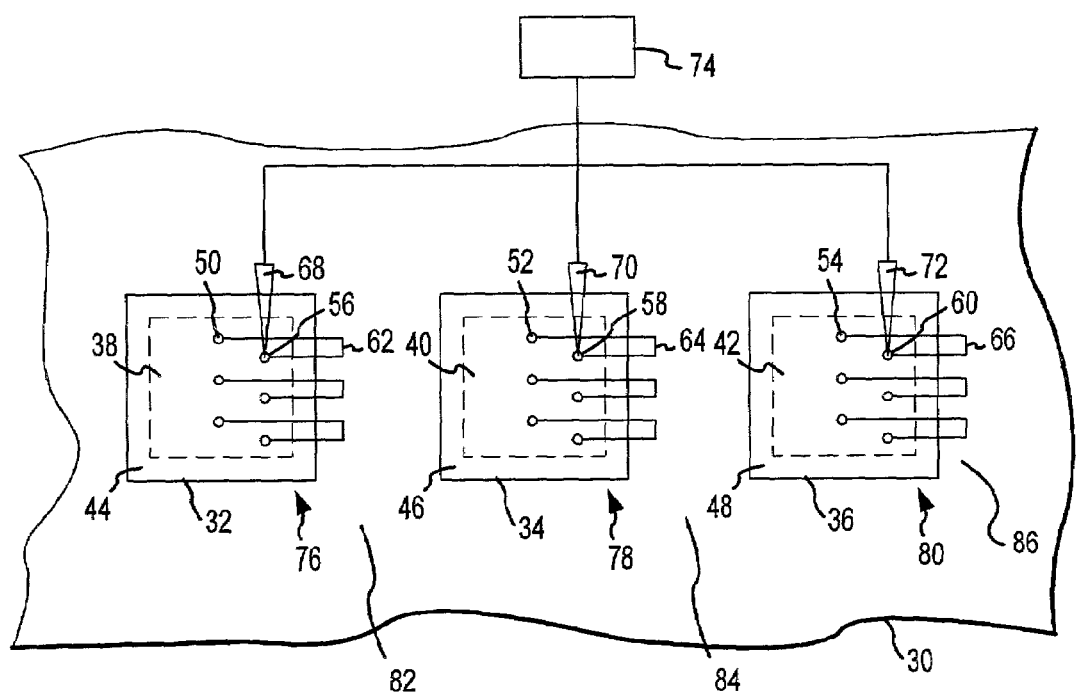
FIG. 3 is a schematic illustration of a wafer with die being tested by a testing apparatus.

A method for testing a die using an exemplary embodiment of the die assembly of the present invention will now be described. FIG. 3 illustrates die assemblies 76, 78 and 80 that are formed on a wafer 30 and are proximate scribe areas 82, 84 and 86. While FIG. 3 illustrates three die assemblies formed on wafer 30, it will be appreciated that any suitable number of die assemblies may be formed on wafer 30. Each die assembly 76, 78 and 80 has a die 32, 34 and 36 formed in a conventional manner as is well known and widely practiced in the semiconductor industry. Each of the die 32, 34 and 36 includes an active portion 38, 40 and 42, respectively, surrounded by an inactive portion 44, 46 and 48, respectively. Active portions 38, 40 and 42 include the integrated circuitry of the die. A minimal amount of integrated circuitry is formed in the inactive portions of 44, 46 and 48, although preferably no integrated circuitry that is integral to the functioning of the die is formed in the inactive portions. No integrated circuitry that is integral to the functioning of the die is formed in the scribe areas 82, 84 and 86. At least one input bond pad 50, 52 and 54 and at least one test pad 56, 58, and 60 are formed in active portions 38, 40 and 42, respectively. As illustrated in FIG. 3, input bond pads 50, 52 and 54 are connected to test pads 56, 58 and 60 via conductive paths 62, 64, and 66, respectively. While FIG. 3 illustrates one test pad connected to one input bond, it will be appreciated that one test pad may be connected to one or more input bond pads or, alternatively, one input bond pad may be connected to one or more test pads. Conductive paths 62, 64, and 66 are formed to extend from input bond pads 50, 52, and 54 to the scribe areas 82, 84 and 86, respectively, and from the scribe areas 82, 84 and 86 to the respective test pads 56, 58, and 60. A testing apparatus 74 having a plurality of mechanical probes 68, 70, and 72 is suitably configured to test die 32, 34 and 36 at the same time. Mechanical probes 68, 70 and 72 may contact test pads 56, 58, and 60 on die 32, 34 and 36 and apply a test signal to test pads 56, 58 and 60. The test signal is transmitted from test pads 56, 58 and 60 to input bond pads 50, 52 and 54, via conductive paths 62, 64 and 66, respectively, to test the circuitry connected to input bond pads 50, 52 and 54. While FIG. 3 illustrates three die being tested by a testing apparatus, it will be appreciated that any suitable number of die may be tested at the same time by the testing apparatus.

At some time during testing, it may be desirable to electrically isolate one of the die from the remaining die being tested. For example, if die 32 is defective, for example, is a shorted device that draws high current, it may adversely affect the test results of other die 34 and 36 being tested. It may also result in damage to mechanical probes 68, 70 and 72. Accordingly, it may be desirable to electrically isolate die 32 from die 34 and 36 before or during testing. This may be accomplished by severing conductive path 62, such as by laser, thereby isolating the circuitry connected to input bond pad 50 from test pad 56. However, if conductive path 62 is cut at a point on the active portion 38 of die 30, it may become embedded in active portion 38 and make electrical contact with one or more conductive layers of the die. Such undesirable electrical contact will skew the test results for the remaining die 34 and 36. To prevent such undesirable electrical contact, it may be possible to form a protective layer above the integrated circuitry to prevent the embedded conductive path from contacting the underlying circuitry. However, this protective layer adds additional processing steps to fabrication of the die, thus decreasing throughput and increasing fabrication costs.

In contrast, the die assembly of the present invention permits the conductive path 62 to be severed, for example, by laser, in the scribe 82. In this manner, if the conductive path is embedded in the insulative material of the scribe, it will not contact any conductive layer of active portion 38 of die 32. Accordingly, die 32 will be isolated from die 34 and 36 and any signals sent by probe 68 to test pad 56 will not adversely affect the testing of the remaining die 34 and 36. In addition, the die assembly of the present invention does not require an additional protective layer over the integrated circuitry of the die to prevent contact between the conductive path and the integrated circuitry.

It may also be desirable to sever the electrical connection between the test pads and the input bond pads when the die is cut from the wafer. For example, during normal operation of the die, the test pads, which provide no function after the die is separated from the wafer, may adversely affect the capacitance, inductance and resistance of the circuitry of the die. By electrically isolating the test pads from the input bond pads, thereby isolating the test pads from the circuitry connected to the input bond pads, the adverse effects of the test pads are reduced or eliminated. Using the method and structure of the present invention, the conductive paths 20 may be severed at the periphery of die 12 when die 12 is separated from the wafer 14. In this manner, the conductive paths 20 will not become embedded in the active portion of the die and thus will not contact any conductive layers of active portion 24 of die 12. Accordingly, the test pads will be electrically isolated from the integrated circuitry of the die and the operation of the circuitry of the die will not be adversely affected by severing of the conductive paths 20.

Figure 4:
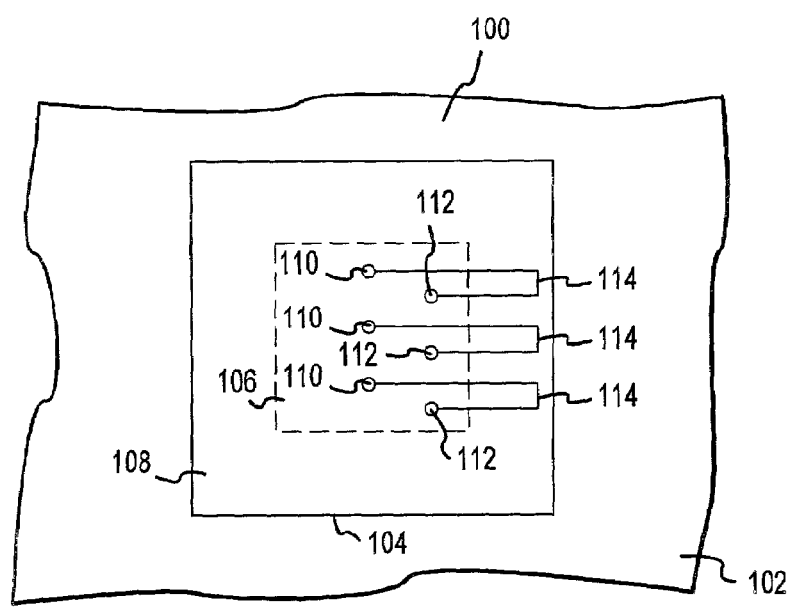
FIGS. 4-6 are schematic illustrations of wafers with die assemblies formed thereon in accordance with other exemplary embodiments of the present invention.

FIG. 4 illustrates another exemplary embodiment of the structure of the present invention. A die assembly 100 is formed on a wafer 102. Die assembly 100 includes a die 104 which is formed in a conventional manner as is well known and widely practiced in the semiconductor industry. Die 104 has an active portion 106 surrounded by an inactive portion 108. Active portion 106 includes the integrated circuitry (not shown) of die 104. A minimal amount of integrated circuitry may be formed in inactive portion 108, although preferably no integrated circuitry that is integral to the functioning of die 104 is formed in the inactive portion. Die 104 includes a plurality of input bond pads 110 and a plurality of test pads 112 formed on active portion 106 of die 104. Input bond pads 110 are connected to the integrated circuitry of die 104. Each of the test pads 112 corresponds to one or more of the input bond pads 110. Alternatively, each of the input bond pads 110 may correspond to one or more of the test pads 112. For purposes of clarity, FIG. 4 illustrates one input bond pad 110 connected to one test pad 112. Test pads 112 are configured to be suitably accessible by a testing apparatus.

Each one of input bond pads 110 is electrically coupled to a test pad 112 by a conductive path 114. Conductive path 114 may be formed of the same material as described for conductive path 20 of FIG. 2. Conductive paths 114 extend from input bond pads 110 to the inactive portion 108 of die 104 and from the inactive portion 108 to test pads 112. In this embodiment, conductive paths 114 may be severed at a point within the inactive portion 108. If conductive paths 114 become embedded in the inactive portion 108 upon being severed, conductive paths 114 will not make electrical contact with the integrated circuitry of the die. Accordingly, test pads 112 may be electrically isolated from input bond pads 110 without adversely affecting the physical or electrical characteristics of die 104.

Figure 5:
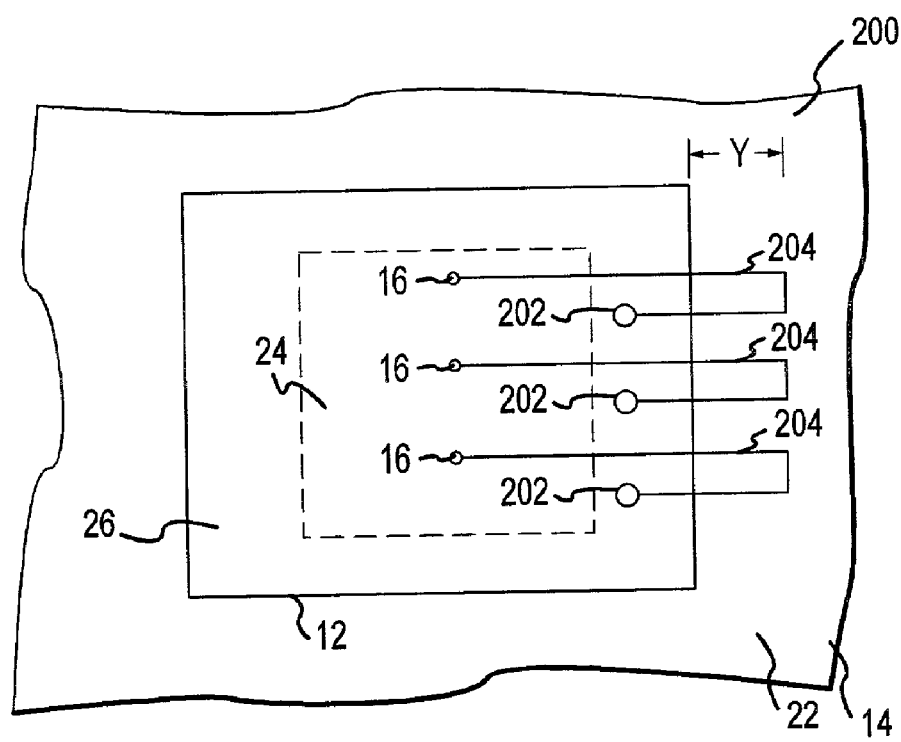

FIG. 5 illustrates yet another exemplary embodiment of the present invention. Die assembly 200 is similar to the die assembly 10 of FIG. 2, as die assembly has a die 12 formed on a wafer 14. Die 12 includes active portion 24 and inactive portion 26. Active portion 24 of die 12 includes input bond pads 16 that are connected to the integrated circuitry (not shown) of die 12. A plurality of test pads 202 are formed on inactive portion 26. Each of the test pads 202 corresponds to one or more of the input bond pads 16. Alternatively, each of the input bond pads 16 may correspond to one or more of the test pads 202. For purposes of clarity, FIG. 5 illustrates one input bond pad 16 connected to one test pad 202. Test pads 202 are configured to be suitably accessible by a testing apparatus.

Each of the input bond pads 16 is electrically coupled to a test pad 202 by a conductive path 204. Conductive paths 204 may be formed of the same material that forms conductive path 20 of FIG. 2. Conductive paths 204 extend from input bond pads 16 on active portion 24 to scribe 22 of wafer 14 and from scribe 22 to test pads 202 formed on the inactive portion 26 of die 12. Preferably, conductive paths 204 may extend a suitable distance, indicated by "y" in FIG. 5, into scribe 22. In this manner, conductive paths 204 may be severed at a point within the scribe 22 without adversely affecting the physical or electrical characteristics of die 12. Alternatively, the conductive paths may suitably extend to the periphery of die 12 where they can be severed upon separation of the die 12 from wafer 14.

Figure 6:
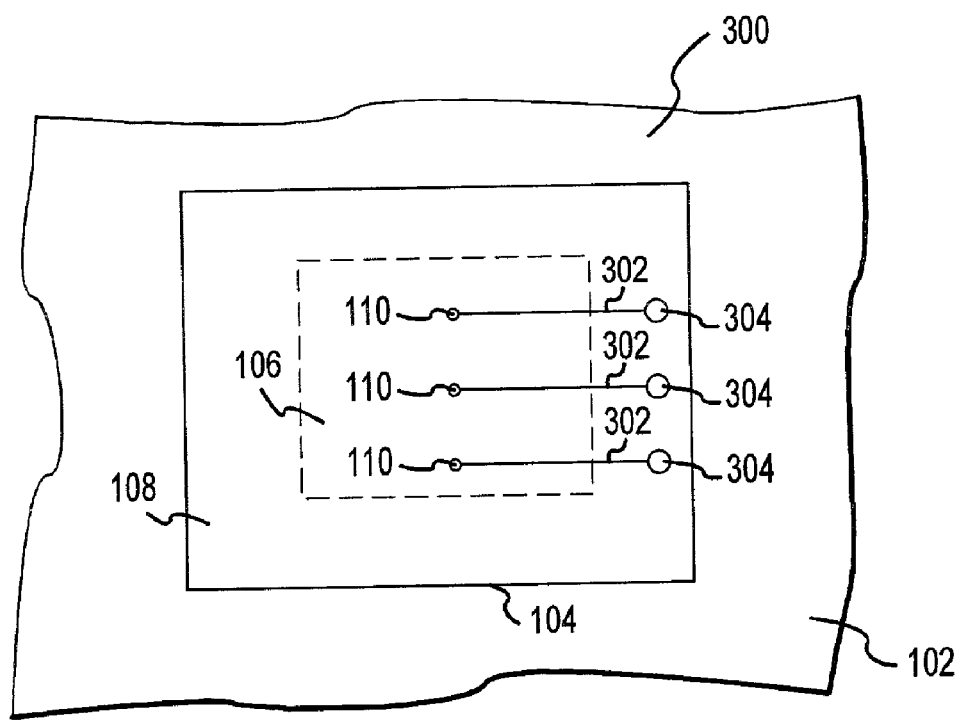

FIG. 6 illustrates a die assembly 300 in accordance with a further exemplary embodiment of the present invention. Die assembly 300 is similar to die assembly 100 of FIG. 4, as die assembly has die 104 formed on wafer 102. Die 104 has active portion 106 surrounded by inactive portion 108. Active portion 106 of die 104 includes input bond pads 110 that are connected to the integrated circuitry (not shown) of die 104. A plurality of test pads 304 are formed on inactive portion 108. Each of the test pads 304 corresponds to one or more of the input bond pads 110. Alternatively, each of the input bond pads 110 may correspond to one or more of the test pads 304. For purposes of clarity, FIG. 6 illustrates one input bond pad 110 connected to one test pad 304. Test pads 304 are configured to be suitably accessible by a testing apparatus.

Each one of input bond pads 110 is electrically coupled to a test pad 304 by a conductive path 302. Conductive paths 302 may be formed of the same material as described for conductive paths 114 of FIG. 4. Conductive paths 302 extend from input bond pads 110 formed on active portion 106 to test pads 304 formed on inactive portion 108. Using this embodiment, conductive paths 302 may be severed at a point within the inactive portion 108 without adversely affecting the physical or electric characteristics of die 104.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a die, the method comprising:
    forming a die on a wafer, said die having one or more lateral edges, an active portion comprising integrated circuitry, and an inactive portion formed between said active portion and at least one lateral edge of said one or more lateral edges of said die, wherein said die has at least one input bond pad formed on said active portion;
    forming at least one test pad on said die; and
    forming a conductive path between said at least one input bond pad and said at least one test pad, wherein a portion of said conductive path is formed on said inactive portion of said die between said at least one lateral edge of said die and said active portion of said die, wherein an additional portion of said conductive path is formed on said wafer outside of said die.

2. The method of claim 1, said forming at least one test pad comprises forming at least one test pad on said active portion of said die.

3. The method of claim 2, said active portion being surrounded by said inactive portion.

4. The method of claim 1, further comprising severing said conductive path at a point outside of said active portion of said die.

5. The method of claim 3, further comprising severing said conductive path at a point within said inactive portion.

6. The method of claim 1, further comprising severing said conductive path at a point outside said die.

7. The method of claim 1, wherein said at least one test pad is of a sufficient size so as to be accessible by a testing apparatus.

8. A die assembly formed on a wafer, the die assembly comprising:
    a die formed on the wafer, said die having one or more lateral edges, an active portion comprising integrated circuitry, and an inactive portion formed between said active portion and at least one lateral edge of said one or more lateral edges of said die;
    at least one input bond pad formed on said active portion of said die;
    at least one test pad formed entirely on said die, wherein said at least one test pad is formed on said active portion of said die; and
    a conductive path that electrically couples said at least one input bond pad to said at least one test pad, wherein a portion of said conductive path is formed on said inactive portion between said at least one lateral edge of said die and said active portion of said die, said active portion of said die being surrounded by said inactive portion of said die, wherein said conductive path extends from said at least one input bond pad to said inactive portion and from said inactive portion to said at least one test pad.

9. The die assembly of claim 8, said die being surrounded by a non-conducting scribe area of the wafer.

10. The die assembly of claim 8, wherein said at least one test pad is of sufficient size so as to be accessible by a testing apparatus.

11. A method for preparing a die on a wafer for testing by a testing apparatus, the method comprising:
    forming a die on a wafer, said die having one or more lateral edges, an active portion comprising integrated circuitry, and an inactive portion formed between said active portion and at least one lateral edge of said one or more lateral edges of said die;
    forming a plurality of input bond pads on said active portion;
    forming a plurality of test pads entirely on said die, said plurality of test pads accessible to the testing apparatus, at least one of said plurality of test pads corresponding to at least one of said plurality of input bond pads;
    forming a conductive path between said at least one of said plurality of test pads and said at least one of said plurality of input bond pads, wherein a portion of said conductive path is formed on said inactive portion between said at least one lateral edge of said die and said active portion of said die, said active portion being surrounded by said inactive portion, wherein said conductive path extends from said at least one input bond pad to said inactive portion and from said inactive portion to said at least one test pad; and
    testing said die by contacting said at least one of said plurality of test pads with the testing apparatus.

12. The method of claim 11, wherein said plurality of test pads are formed on said active portion of said die.

13. The method of claim 11, further comprising severing said conductive path at a point outside of said active portion of said die.

14. The method of claim 11, further comprising severing said conductive path at a point within said inactive portion.

15. The method of claim 11, wherein said at least one of said plurality of test pads is larger in size than said at least one of the plurality of input bond pads.

16. A die comprising:
    one or more lateral edges;
    an active portion comprising integrated circuitry;
    an inactive portion formed between said active portion and at least one lateral edge of said one or more lateral edges of said die;
    a plurality of input bond pads formed on said active portion;
    a plurality of test pads formed entirely on said die; and
    a plurality of conductive lines, wherein each of said conductive lines is initially formed to electrically couple at least one of said plurality of input bond pads to at least one of said plurality of test pads, and wherein a portion of said each of said conductive lines is formed on said inactive portion between said at least one lateral edge of said die and said active portion of the die, wherein an additional portion of said each of said conductive lines is formed outside of the die.

17. The die of claim 16, said plurality of test pads formed on said active portion of said die.

18. The die of claim 16, said active portion being surrounded by said inactive portion.

19. The die of claim 16, the die being formed on a wafer, wherein said portion of said each of said conductive lines is configured to be severed when the die is separated from said wafer.

20. The method of claim 16, wherein said at least one of said plurality of test pads is larger in size than said at least one of said plurality of input bond pads.

21. A die comprising:

an active portion comprising integrated circuitry;

a plurality of input bond pads formed on said active portion;

a plurality of test pads formed on said die;

a plurality of conductive lines, wherein each of said conductive lines is initially formed to electrically couple at least one of said plurality of input bond pads to at least one of said plurality of test pads, and wherein a portion of said each of said conductive lines is formed on a scribe area outside the die.

* * * * *